(12) United States Patent
Ando et al.

(10) Patent No.: US 12,507,465 B2
(45) Date of Patent: Dec. 23, 2025

(54) DIELECTRIC TUNING OF NEGATIVE CAPACITANCE IN DUAL CHANNEL FIELD EFFECT TRANSISTORS

(71) Applicant: International Business Machines Corporation, Armonk, NY (US)

(72) Inventors: Takashi Ando, Eastchester, NY (US); Reinaldo Vega, Mahopac, NY (US); Praneet Adusumilli, Somerset, NJ (US); Cheng Chi, Jersey City, NJ (US)

(73) Assignee: International Business Machines Corporation, Armonk, NY (US)

( * ) Notice: Subject to any disclaimer, the term of this patent is extended or adjusted under 35 U.S.C. 154(b) by 778 days.

(21) Appl. No.: 17/688,873

(22) Filed: Mar. 7, 2022

(65) Prior Publication Data
US 2023/0282523 A1 Sep. 7, 2023

(51) Int. Cl.
*H10D 84/03* (2025.01)
*H10D 64/66* (2025.01)
(Continued)

(52) U.S. Cl.
CPC ......... *H10D 84/038* (2025.01); *H10D 64/666* (2025.01); *H10D 64/667* (2025.01);
(Continued)

(58) Field of Classification Search
CPC .. H10D 84/038; H10D 64/666; H10D 64/667; H10D 64/691; H10D 64/693;
(Continued)

(56) References Cited

U.S. PATENT DOCUMENTS 6,943,633 B2 9/2005 Singh
8,030,716 B2 10/2011 Park
(Continued)

OTHER PUBLICATIONS

Authors et. al.: Disclosed Without Attribution. IP.com No. IPCOM000259733D, "Method and Structure for Fabricating Negative Capacitance Field Effect Transistor (NCFET) with Daisy Chained Ferroelectric/ Dielectric Stacks and Complementary Logic with Shared Ferroelectric Capacitor", Sep. 11, 2019, 6 pages.
Ota, et al., Perspective of Negative Capacitance FinFETs Investigated by Transient TCAD Simulation, IEEE International Electron Devices Meeting (IEDM), Dec. 2-6, 2017, pp. 15.2.1-15.2.4.
(Continued)

*Primary Examiner* — Fernando L Toledo
*Assistant Examiner* — Shawn Shaw Muslim
(74) *Attorney, Agent, or Firm* — L. Jeffrey Kelly; Otterstedt & Kammer PLLC

(57) ABSTRACT

A transistor structure includes a semiconductor substrate; an NFET channel structure atop the substrate; a PFET channel structure atop the substrate; a first dielectric atop the PFET channel structure; a second dielectric atop the NFET channel structure; a shared internal metal gate atop the dielectrics; a shared ferroelectric layer atop the shared internal metal gate; and a shared external gate electrode atop the shared ferroelectric layer. The first and second dielectrics are doped with different metals that provide differing overall work functions for the PFET and the NFET. A method for making a transistor structure includes depositing a shared dielectric onto an NFET channel structure and a PFET channel structure, and converting the shared dielectric to a first high-k dielectric atop the PFET channel structure and a second high-k dielectric atop the NFET channel structure. The first high-k dielectric and the second high-k dielectric are doped with different metals.

20 Claims, 5 Drawing Sheets

(51) Int. Cl.
*H10D 64/68* (2025.01)
*H10D 84/01* (2025.01)

(52) U.S. Cl.
CPC ......... *H10D 64/691* (2025.01); *H10D 64/693* (2025.01); *H10D 84/0177* (2025.01)

(58) Field of Classification Search
CPC ............. H10D 84/0177; H10D 64/689; H10D 84/0181; H10D 84/85
See application file for complete search history.

(56) References Cited

U.S. PATENT DOCUMENTS

| | | | |
|---|---|---|---|
| 9,997,518 B2 | 6/2018 | Bao | |
| 10,236,219 B1* | 3/2019 | Anderson | H10D 84/0193 |
| 10,770,353 B2 | 9/2020 | Wang | |
| 2015/0021699 A1 | 1/2015 | Ando | |
| 2022/0278115 A1* | 9/2022 | Wei | H10D 1/692 |

OTHER PUBLICATIONS

Datta, S., Brask, J., Dewey, G., Doczy, M., Doyle, B., Jin, B., . . . & Chau, R. (Sep. 2004). Advanced Si and SiGe strained channel NMOS and PMOS transistors with high-K/metal-gate stack. In Bipolar/BiCMOS Circuits and Technology, 2004. Proceedings of the 2004 Meeting (pp. 194-197). IEEE.

Min, J., & Shin, C. (Sep. 2, 2020). MFMIS negative Capacitance FinFET Design for Improving Drive Current. Electronics, 9(9), 1423. 7 pages total.

Sato, F., Ramachandran, R., Van Meer, H., Cho, K. H., Ozbek, A., Yang, X., . . . & Divakaruni, R. (Jun. 2013). Process and Local Layout Effect interaction on a high performance planar 20nm CMOS. In 2013 Symposium on VLSI Technology (pp. T116-T117). IEEE.

"Junction Design and Complementary Capacitance Matching for NCFET CMOS Logic," authors Reinaldo E. Vega, Takashi Ando, Timothy M. Philip, published Jul. 9, 2021 in Journal of Electron Devices Society, pp. 691-703. (Grace Period Disclosure).

* cited by examiner

DIELECTRIC TUNING OF NEGATIVE CAPACITANCE IN DUAL CHANNEL FIELD EFFECT TRANSISTORS

STATEMENT REGARDING PRIOR DISCLOSURES BY THE INVENTOR OR A JOINT INVENTOR

The following disclosure(s) are submitted under 35 U.S.C. 102(b)(1)(A):

DISCLOSURE(S): "Junction Design and Complementary Capacitance Matching for NCFET CMOS Logic," authors Reinaldo E. Vega, Takashi Ando, Timothy M. Philip, published 9 Jul. 2021 in Journal of Electron Devices Society, pages 691-703.

BACKGROUND

The present invention relates to the electrical, electronic, and computer arts, and more specifically, to complementary metal-oxide-semiconductor (CMOS) field effect transistor (FET) technologies.

Field effect transistors (FETs) operate on a principle that imposing an electrical field on a semiconductor distorts the pathway (channel) by which charge can move through the semiconductor, either widening the channel (in an enhancement mode FET) or shrinking the channel (in a depletion mode FET). Metal-oxide-semiconductor (MOSFETs) are the most common type of FETs. MOSFETs include source and drain semiconductors that are connected by a channel structure semiconductor. In a MOSFET, a metal-containing gate stack, adjacent to the channel structure, is used to impose the electrical field that distorts the channel. It is advantageous to fabricate MOSFETs on a complementary (CMOS) plan, in which an n-doped channel structure (NFET) is adjacent on the same substrate to a p-doped channel structure (PFET). Choice of metals for the NFET and PFET gate stacks affects threshold voltages of the MOSFET according to the work functions of the metals; gate stack metals often are referred to as "work function metals," "work function materials," or "WFM." Frequently there are tradeoffs as to which WFM are used in order to approach optimal threshold voltages for the NFET and PFET.

SUMMARY

Principles of the invention provide techniques for dielectric tuning of negative capacitance in dual channel field effect transistors. In one aspect, an exemplary CMOS structure includes a semiconductor substrate; an NFET channel structure atop the substrate; a PFET channel structure atop the substrate; a first dielectric atop the PFET channel; a second dielectric atop the NFET channel; a shared internal metal gate atop the first and second dielectrics; a shared ferroelectric layer atop the shared internal metal gate; and a shared external gate electrode atop the shared ferroelectric layer. An aspect of the invention is that, beyond the conventional understanding (as further discussed below) that gate stack metals alone define the work functions of field effect transistors, i.e., in one or more embodiments the first and second dielectrics also are doped with different metals that provide differing work functions of the PFET and the NFET.

According to another aspect, an exemplary method for fabricating a complementary metal-oxide-semiconductor field effect transistor (MOSFET) structure includes forming an NFET channel structure and a PFET channel structure on a common substrate. The method further includes depositing onto the NFET channel structure and the PFET channel structure a shared dielectric, and converting the shared dielectric to a first high-k dielectric atop the PFET channel structure and a second high-k dielectric atop the NFET channel structure; the first high-k dielectric and the second high-k dielectric are doped with different metals. The method also includes depositing onto the first and second high-k dielectrics a shared internal metal gate; depositing onto the shared internal metal gate a ferroelectric layer; and depositing onto the ferroelectric layer a shared external gate electrode.

In view of the foregoing, techniques of the present invention can provide substantial beneficial technical effects. For example, one or more embodiments provide one or more of:

A MOSFET that exhibits a good matching of negative capacitance and gate capacitance in a wider range of operating voltages, which results in improved subthreshold swing.

Dual channels and high-k doping are used to individually tune NFET and PFET threshold voltage (Vt) in order to achieve low Vt pair.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

Figure 1:
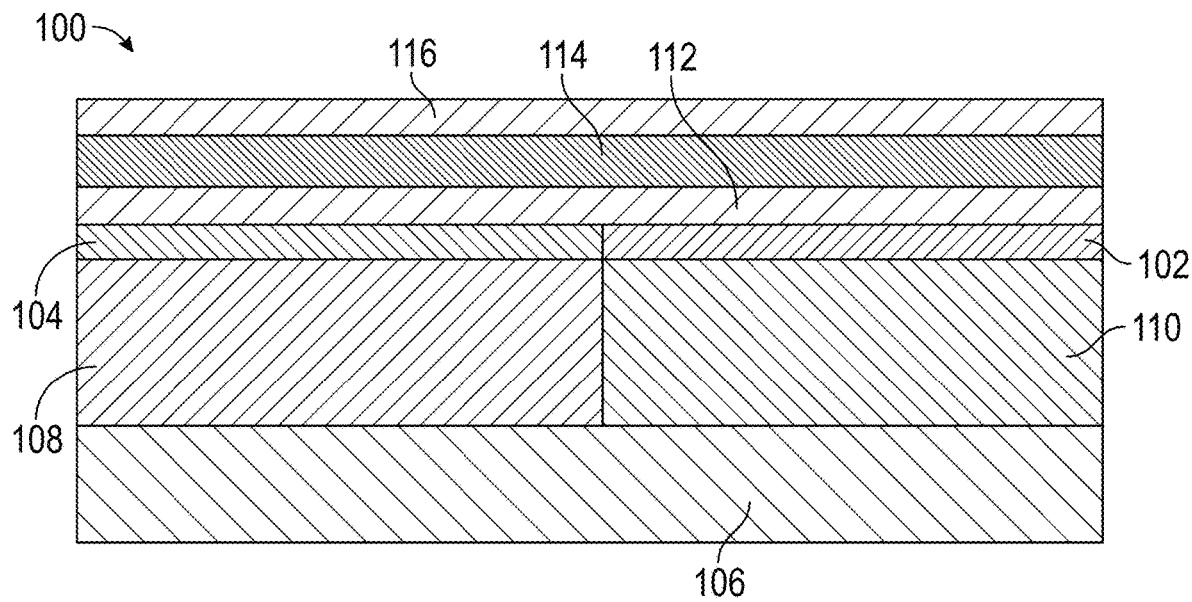
FIG. 1 depicts in a schematic a complementary metal-oxide-semiconductor field effect transistor (MOSFET) in which PFET and NFET dielectrics are selected to tune threshold voltages of the individual MOSFETs, according to exemplary embodiments.

FIG. 1 depicts in a schematic a complementary metal-oxide-semiconductor field effect transistor (MOSFET) structure 100, in which a first (PFET) dielectric 102 and a second (NFET) dielectric 104 are selected to tune threshold voltages of the MOSFET, according to exemplary embodiments, thereby forming an improved negative capacitance FET (NCFET). Further details of FIG. 1 will be discussed following the ensuing explanation of negative capacitance. At a high level of understanding, an NCFET according to exemplary embodiments has steeper subthreshold slopes with low NFET and PFET threshold voltages, compared to conventional CMOS. These properties of the inventive NCFET enable lower supply (operation) voltages compared to conventional CMOS technology.

Figure 2:
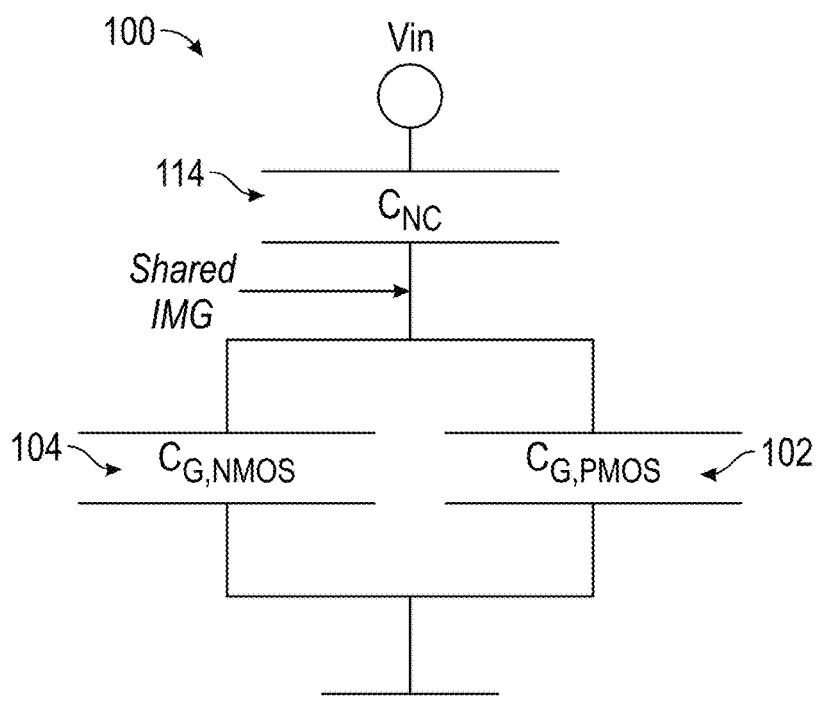
FIG. 2 depicts a simplified circuit diagram of the MOSFET shown in FIG. 1.

Negative capacitance (NC), as a property of ferroelectric materials, has been demonstrated in the gigahertz (GHz) range of frequencies where many transistors switch. Computer simulations suggest that the NC effect can be realized across a wider range of voltages by connecting ferroelectric capacitor to a pair of parallelly connected NMOS and PMOS devices with lower threshold voltages (see, e.g., FIG. 3). In general, an NCFET device is similar to a normal transistor except for the replacement of a high-κ dielectric layer with a ferroelectric layer. See, for example, layer 114 (discussed further below) in FIG. 1 and in FIG. 2 (FIG. 2 depicts capacitances of the NMOS device, PMOS device, and negative capacitance NC of the ferroelectric layer 114 of the MOSFET structure 100 of FIG. 1 in schematic form). Alternatively, in certain of the present embodiments, the high-κ layer in related transistor technologies may be retained, with the addition of a ferroelectric layer on the high-κ layer. In one example, when a ferroelectric layer is in series with a dielectric layer, if it is operated within a certain regime, and if the thicknesses of the two layers are matched appropriately, the overall transistor device may exhibit what is commonly referred to as a negative capacitance effect.

With regard to the ferroelectric switching between different polarization states of the device (i.e., it can be polarized to a positive charge or a negative charge), computer simulations suggest there is a hysteresis loop in charge versus the applied field. If the ferroelectric layer is put in electrical series with the dielectric layer, it is possible to access a region that is in the middle of the hysteresis loop where there is a negative slope. The negative slope region of the device exhibits the negative capacitance effect of the NCFET device. Moreover, if the negative slope of the ferroelectric layer matches closely enough with the slope of the dielectric capacitance, then a high voltage gain may be achieved. One criteria that defines an NCFET device is that the absolute value of the negative capacitance of the ferroelectric layer should be higher than the capacitance of the dielectric layer that is in series with the ferroelectric layer.

NCFETs have attracted attention for their theoretical capability to provide very steep subthreshold swing ("SS," i.e., a steep slope of the curve describing drain current ID versus gate voltage VGs) under certain conditions. Generally, SS is improved near inversion of an NCFET by making the negative capacitance of the ferroelectric layer ($C_{NC}$) greater than the FET's inversion-layer capacitance ($C_{inv}$). However, this means that $C_{NC}$ is much greater than the FET's overlap capacitance ($C_{OV}$) in the off state. Accordingly, it has been generally accepted that there is a tradeoff in current technology for NCFETs, which is that improving subthreshold swing (making the slope steeper) increases hysteresis of switching. This makes NCFETs more suitable for memory applications, less suitable for logic applications.

Indeed, NCFETs are not a simple "plug and play" into existing CMOS technologies, which are optimized with shallow/sharp junctions and at considerable development cost, to optimize a trade-off between short channel effects (SCE) and external resistance (Rext). Previous researchers have reported sub-optimal DC parametric and AC NCFET performance, when used as drop-in replacements for CMOS devices.

In a CMOS logic gate, the NFET and PFET gate share the same gate finger, which also means a shared internal metal gate (IMG), see, for example, layer 112 in FIG. 1. An aspect of the invention is an understanding that matching PFET $C_{inv}$ to NC will steepen the subthreshold swing (SS) of the NFET, and similarly for the NFET $C_{inv}$ and PFET SS. A further aspect of the invention is an understanding that matching PFET SS and NFET SS (complementary capacitance matching, or CCM) will produce an overall voltage-response curve that approaches flatness across the operating range of the CMOS device. A shared internal metal gate makes it difficult to achieve CCM because of how the shared metal affects the work functions and threshold voltages of the NFET and PFET.

Figure 3:
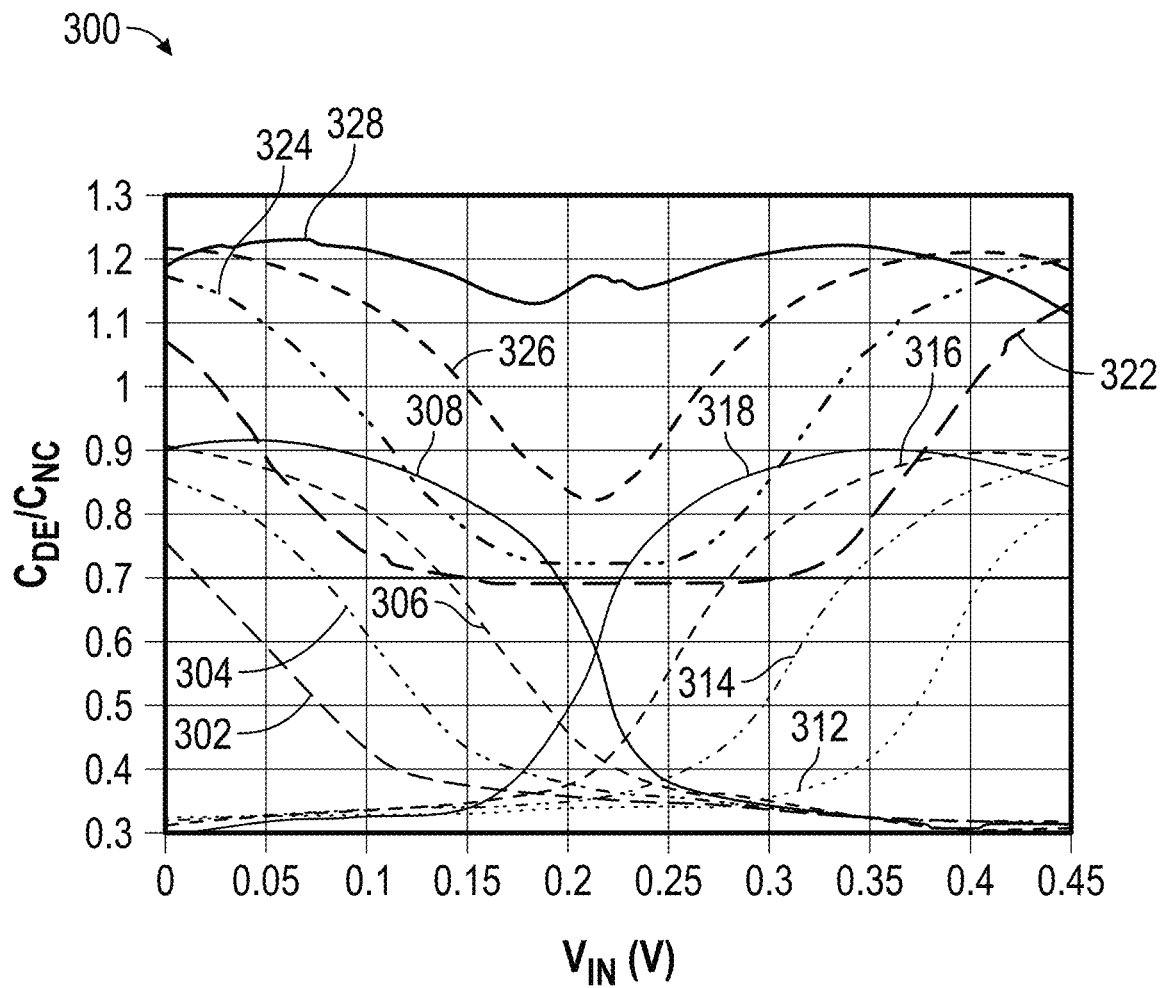
FIG. 3 depicts a graph of voltage response curves for an NFET, a PFET, and a CMOS structure comprising the NFET and the PFET, according to exemplary embodiments.

See the graph 300 of capacitance matching ratios, shown in FIG. 3. Capacitance ratio $C_{DE}/C_{NC}$, on the ordinate, represents a ratio of the parallel sum of capacitances of PFET and NFET to the negative capacitance of the ferroelectric layer. Input voltage $V_{IN}$, on the abscissa, is the gate voltage. Curves 302, 304, 306, 308 represent PFET capacitance ratio for PFET work function (WF) values of 4.6, 4.7, 4.8, and 4.9 eV, respectively. Curves 312, 314, 316, 318 represent NFET capacitance ratio for NFET work function (WF) values of 4.6, 4.5, 4.4, and 4.3 eV, respectively. Curves 322, 324, 326, 328 represent combined CMOS capacitance ratio for devices that combine PFETs and NFETs described by curves 302 and 312, 304 and 314, 306 and 316, 308 and 318, respectively. Note the increasingly lower threshold voltages pair of PFET and NFET (i.e. higher PWF and lower NWF), produce increasingly flatter capacitance ratio curves for the MOSFET as a whole. This results in capacitance matching across a wider range of voltages. This demonstrates an advantage of the CCM effect discussed above.

Accordingly, as shown in FIG. 1, the MOSFET structure 100 includes a semiconductor substrate 106; an NFET channel structure 108 atop the substrate; a PFET channel structure 110 adjacent to the NFET; the first (PFET) dielectric 102 atop the PFET channel structure; the second (NFET) dielectric 104 atop the NFET channel structure; a shared internal metal gate 112 atop the first and second dielectrics; a shared ferroelectric layer 114 atop the shared internal metal gate; and a shared external gate electrode 116 atop the shared ferroelectric layer. Note that, although for ease of illustration FIG. 1 shows a sequence of planar layers, in one or more embodiments the profiles of the layers may be non-planar, e.g., the channel structures comprise one or more vertical fins or stacks of nanosheets and the other layers are wrapped around the channel structures. The "channel structure" is the physical region where the channel forms when the gate is energized. The first dielectric is selected so that overall $C_{inv}$ of the PFET approximates the absolute value of NC of the shared ferroelectric layer. The second dielectric is selected so that overall $C_{inv}$ of the NFET approximates the absolute value of NC of the shared ferroelectric layer. Exemplary materials for the shared ferroelectric layer include hafnium zirconium oxide, hafnium silicon oxide, hafnium aluminum oxide. An exemplary material for the first (PFET) dielectric is hafnium oxide with aluminum as a dopant. An exemplary material for the second (NFET) dielectric is hafnium oxide with a Group 2A or Group 3B metal as a dopant. Various hafnium- or zirconium-containing oxides are applicable, e.g., HfO2 and ZrO2. In one or more embodiments, both NFET and PFET use the same material. Exemplary materials for the shared internal metal gate include titanium nitride. Exemplary materials for the shared external gate electrode include titanium nitride.

Figure 4:
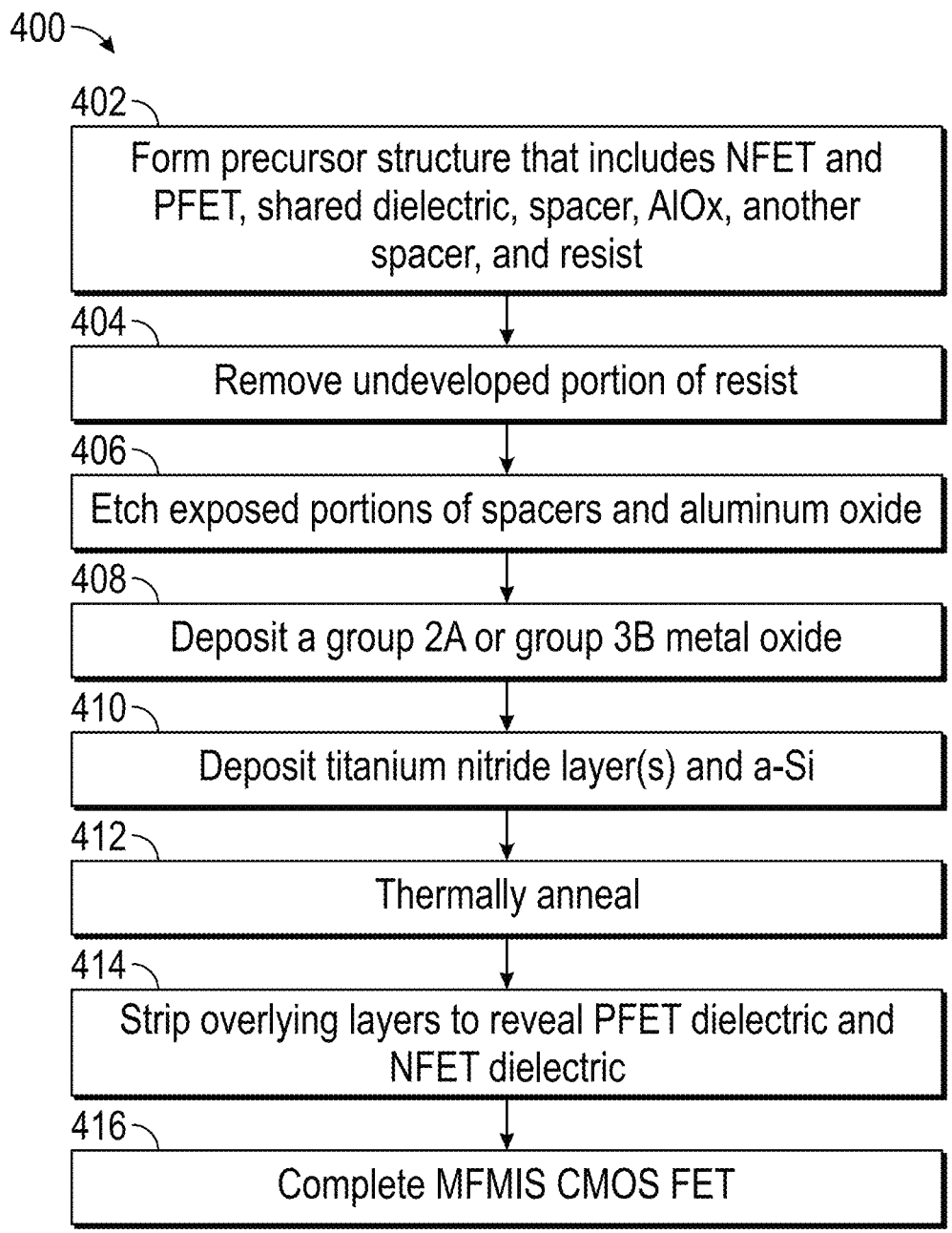
FIG. 4 depicts in a flow chart steps of a process for forming the MOSFET shown in FIG. 1, according to exemplary embodiments.

FIG. 4 depicts in a flow chart steps of an exemplary method 400 for forming the MOSFET structure 100 that is shown in FIG. 1, according to exemplary embodiments. FIG. 5 through FIG. 11 depict in schematics intermediate structures 500, 600, 700, 800, 900, 1000, 1100 that are formed according to steps of the process shown in FIG. 4.

Figure 5:
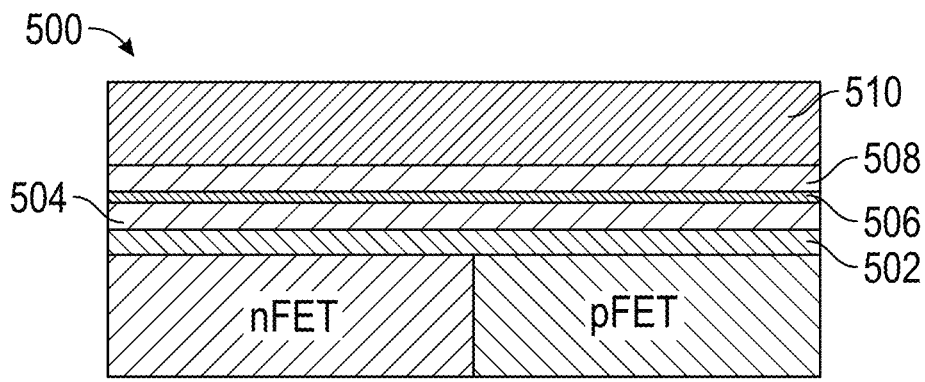
FIG. 5 through FIG. 11 depict in schematics intermediate structures that are formed according to steps of the process shown in FIG. 4.

Referring to FIG. 4, at 402 form a precursor structure 500, as shown in FIG. 5, that includes the NFET channel structure 108 and the PFET channel structure 110. An ordinary skilled worker will appreciate that an insulator, e.g., shallow trench isolation, separates the NFET channel structure 108 and the PFET channel structure 110. The structure 500 also includes a shared dielectric layer 502, e.g., hafnium oxide, on top of the NFET channel and the PFET channel. The structure 500 also includes a metal layer 504, e.g., titanium nitride, an aluminum containing layer 506, another metal layer 508, and a resist layer 510.

Figure 6:
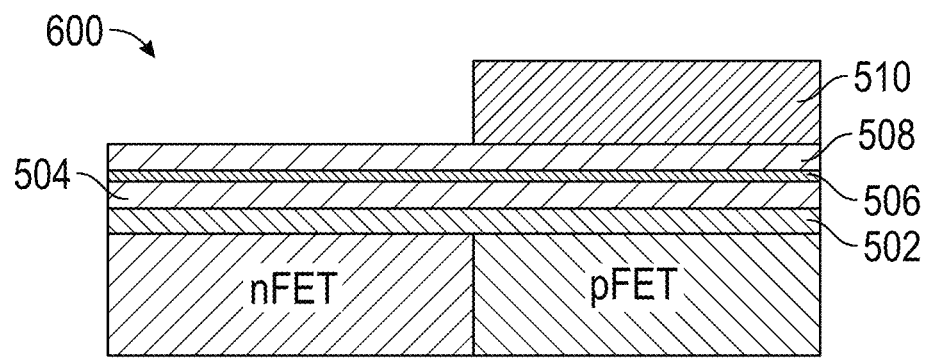
Figure 7:
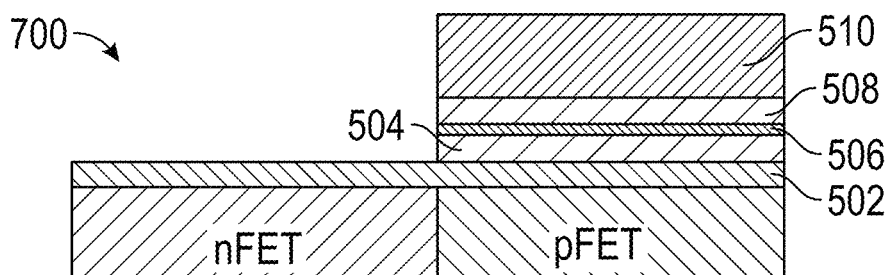

After developing a portion of the resist layer 410 that overlies the PFET channel structure 110, at 404 remove the undeveloped portion of resist to form structure 600, as shown in FIG. 6. At 406 etch the exposed metal and aluminum containing layers to produce structure 700, as shown in FIG. 7, which exposes a portion of the dielectric layer 502 that overlies the NFET channel structure 108.

Figure 8:
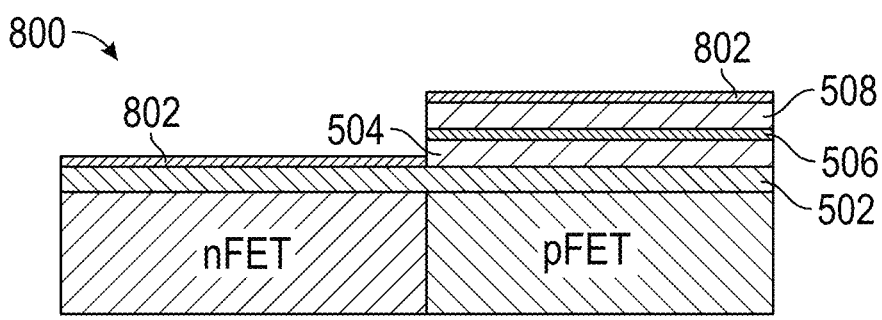

At 408, deposit a group 2A or group 3B metal oxide 802, e.g., lanthanum oxide, to form structure 800, as shown in FIG. 8, in which the group 2A or group 3B metal oxide 802 lies directly on top of the dielectric layer 502.

Figure 9:
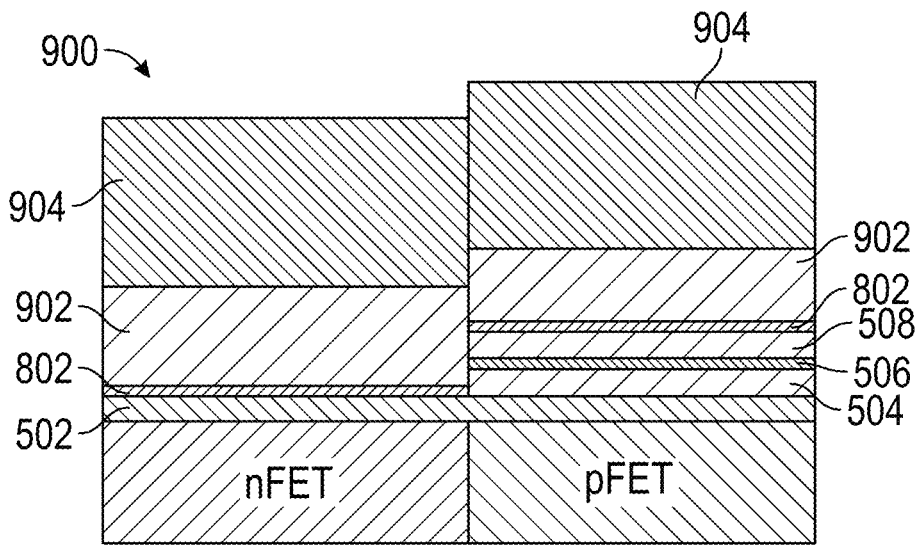

At 410, form a structure 900, as shown in FIG. 9, by depositing titanium nitride layer(s) 902, followed by amorphous silicon 904.

Figure 10:
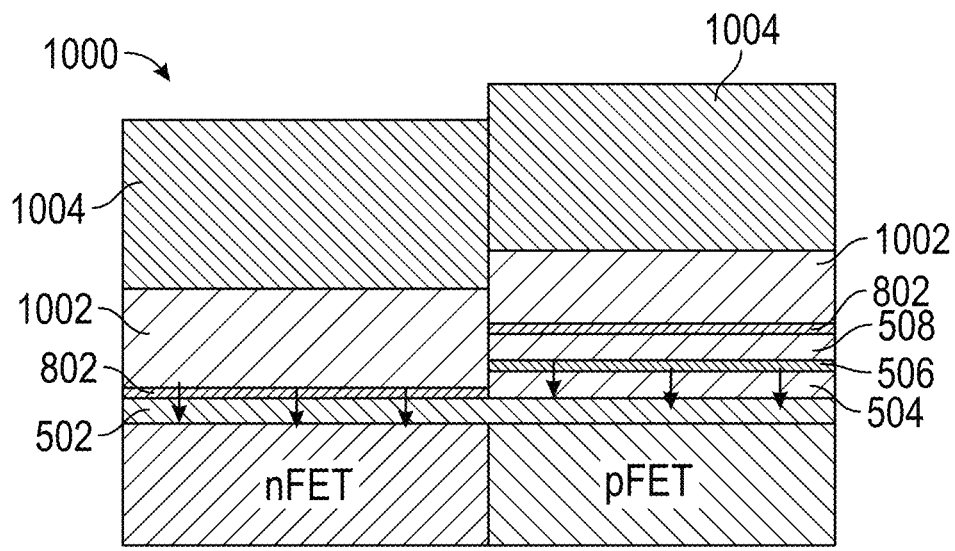

At 412, form a structure 1000, as shown in FIG. 10, by thermally annealing the structure 900, thereby diffusing the aluminum and the group 2A or group 3B metal elements into portions of the dielectric layer 502 that overlie the PFET channel structure 110 and the NFET channel structure 108, respectively. This step forms the first (PFET) dielectric 102 and the second (NFET) dielectric 104, as shown in FIG. 11, which later result in the inversion-layer capacitances $C_{inv}$ of the PFET channel structure 110 and of the NFET channel structure 108 approximating the absolute value of the negative capacitance NC of the ferroelectric layer 114.

Figure 11:
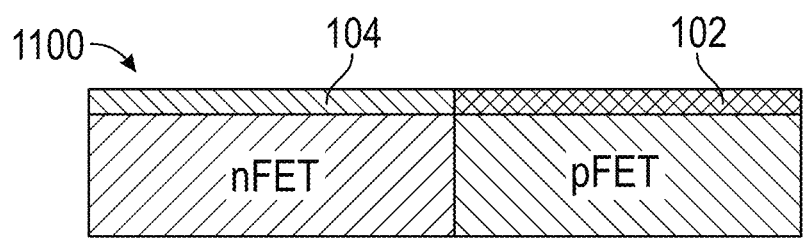

At 414, produce structure 1100, as shown in FIG. 11, by stripping overlying layers to reveal the PFET dielectric 102 and the NFET dielectric 104.

Then at 416, complete the metal-ferroelectric-metal-insulator-semiconductor (MFMIS) MOSFET structure 100 (shown in FIG. 1) by depositing shared internal metal gate 112, ferroelectric layer 114, and shared external gate electrode 116.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, di chlorosilane, trichlorosilane, di silane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 3001 and P. H. Holloway et al., Handbook of Compound Semiconductors: Growth, Processing, Characterization, and Devices, Cambridge University Press, 3008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Gate stacks in both nFET and pFET structures (in embodiments having both types of regions) include work function material (WFM) layers. Non-limiting examples of suitable work function (gate) metals include p-type work function materials and n-type work function materials. Common P-type work function materials include compositions such as ruthenium, palladium, platinum, cobalt, nickel, and conductive metal nitride like TiN, WN, or any combination thereof. Common N-type work function materials include compositions such as hafnium, zirconium, titanium, tantalum, aluminum, metal carbides (e.g., hafnium carbide, zirconium carbide, titanium carbide, and aluminum carbide), aluminides, or any combination thereof. However, embodiments of this invention achieve negative capacitance by using a single shared material as the work function material for both NFET and PFET. For example, titanium nitride is used for the shared internal metal gate. Other thermally stable metals, such as tantalum nitride and tungsten, also are suitable for the gate metal.

The work function material(s) may be deposited by a suitable deposition process, for example, ALD, CVD, PECVD, PVD, plating, and thermal or e-beam evaporation.

Given the discussion thus far, and with reference to the accompanying drawings, it will be appreciated that, in general terms, an exemplary metal-oxide-semiconductor field effect transistor (MOSFET structure 100), according to an aspect of the invention, includes a semiconductor substrate 106; an NFET channel structure 108 atop the substrate; a PFET channel structure 110 atop the substrate; a first dielectric 102 atop the PFET channel; a second dielectric 104 atop the NFET channel; a shared internal metal gate 112 atop the first and second dielectrics; a shared ferroelectric layer 114 atop the shared internal metal gate; and a shared external gate electrode 116 atop the shared ferroelectric layer. The first and second dielectrics are doped with different metals that provide differing work functions of the NFET and the PFET. It will be understood that "atop" means either directly contacting a layer, or with one or more intervening layers that do not alter the performance of the device. Additionally, consistent with a preceding discussion of how in one or more embodiments the finished structure may be planar, finFET, or nanosheet FET, among other structural options, "atop" is to be understood a nonce word that can also mean "beside" or "surrounding" or "enclosed by," among other potential meanings depending upon the final structure.

In one or more embodiments, the shared ferroelectric layer comprises a material selected from the group consisting of: hafnium zirconium oxide, hafnium silicon oxide, hafnium aluminum oxide. In one or more embodiments, the shared internal metal gate comprises titanium nitride. In one or more embodiments, the shared external gate electrode comprises a material selected from the group consisting of: titanium, tungsten, tantalum, aluminum. In one or more embodiments, the first and second dielectrics are high-k dielectrics. In one or more embodiments, the first dielectric comprises hafnium with aluminum as a dopant. In one or more embodiments, the second dielectric comprises hafnium with a group 2A metal as a dopant. In one or more embodiments, the second dielectric comprises hafnium with a group 3B metal as a dopant. In one or more embodiments, the first dielectric comprises zirconium with aluminum as a dopant. In one or more embodiments, the second dielectric comprises zirconium with a group 2A metal as a dopant. In one or more embodiments, the second dielectric comprises zirconium with a group 3B metal as a dopant. In one or more embodiments, the NFET channel comprises silicon and the PFET channel comprises a silicon-germanium alloy.

According to another aspect, an exemplary method 400 for fabricating a complementary metal-oxide-semiconductor field effect transistor (MOSFET structure 100) includes, at 402, forming an NFET channel structure 108 and a PFET channel structure 110 on a common substrate 106. The method further includes, at 402, depositing a shared dielectric onto the NFET channel structure and the PFET channel structure, and at 404, 406, 408, 410, 412, converting the shared dielectric to a first high-k dielectric atop the PFET channel structure and a second high-k dielectric atop the NFET channel structure; the first high-k dielectric and the second high-k dielectric are doped with different metals. The method also includes, at 416, depositing onto the first and second high-k dielectrics a shared internal metal gate; depositing onto the shared internal metal gate a ferroelectric layer; and depositing onto the ferroelectric layer a shared external gate electrode.

In one or more embodiments, the first high-k dielectric is doped with aluminum and the second high-k dielectric is doped with a material selected from the list consisting of Group 2A and Group 3B metals. In one or more embodiments, depositing the shared dielectric comprises depositing hafnium oxide. In one or more embodiments, depositing the shared dielectric comprises depositing zirconium oxide. In one or more embodiments, converting the shared dielectric to the first high-k dielectric comprises depositing aluminum and thermally annealing. In one or more embodiments, depositing the shared internal metal gate comprises depositing titanium nitride. In one or more embodiments, depositing the ferroelectric layer comprises depositing a hafnium oxide. In one or more embodiments, depositing the shared external gate electrode comprises depositing a material selected from the group consisting of titanium nitride, tantalum, and tungsten.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A complementary metal-oxide-semiconductor field effect transistor structure, comprising:
    a semiconductor substrate;
    an NFET channel structure directly atop and contacting the substrate;
    a PFET channel structure directly atop and contacting the substrate, the PFET channel structure adjacent the NFET channel structure;
    a first dielectric directly atop and contacting the PFET channel structure;
    a second dielectric directly atop and contacting the NFET channel structure, the second dielectric directly adjacent the first dielectric;
    a shared internal metal gate directly atop and contacting the first and second dielectrics, wherein the first dielectric is sandwiched between the PFET channel structure and the shared internal metal gate and the second dielectric is sandwiched between the NFET channel structure and the shared internal metal gate;
    a shared ferroelectric layer directly atop and contacting the shared internal metal gate; and
    a shared external gate electrode directly atop and contacting the shared ferroelectric layer,
    wherein the first and second dielectrics are doped with different metals that provide differing overall work functions of the PFET and the NFET.

2. The structure of claim 1, wherein the shared ferroelectric layer comprises a material selected from the group consisting of: hafnium zirconium oxide, hafnium silicon oxide, hafnium aluminum oxide.

3. The structure of claim 1, wherein the shared internal metal gate comprises titanium nitride.

4. The structure of claim 1, wherein the shared external gate electrode comprises a material selected from the group consisting of: titanium, tungsten, tantalum, aluminum.

5. The structure of claim 1, wherein the first and second dielectrics are high-k dielectrics.

6. The structure of claim 5, wherein the first dielectric comprises hafnium with aluminum as a dopant.

7. The structure of claim 6, wherein the second dielectric comprises hafnium with a group 2A metal as a dopant.

8. The structure of claim 6, wherein the second dielectric comprises hafnium with a group 3B metal as a dopant.

9. The structure of claim 5, wherein the first dielectric comprises zirconium with aluminum as a dopant.

10. The structure of claim 9, wherein the second dielectric comprises zirconium with a group 2A metal as a dopant.

11. The structure of claim 9, wherein the second dielectric comprises zirconium with a group 3B metal as a dopant.

12. The structure of claim 1, wherein the NFET channel comprises silicon and the PFET channel comprises a silicon-germanium alloy.

13. A method for fabricating a complementary metal-oxide-semiconductor field effect transistor structure, the method comprising:
    forming an NFET channel structure and a PFET channel structure directly on a common substrate, the PFET channel structure adjacent the NFET channel structure;
    depositing a shared dielectric directly onto the NFET channel structure and the PFET channel structure;
    converting the shared dielectric to a first high-k dielectric directly atop the PFET channel structure and a second high-k dielectric directly atop the NFET channel structure and directly adjacent the first high-k dielectric, by doping the first high-k dielectric and the second high-k dielectric with different metals;
    depositing directly onto the first and second high-k dielectrics a shared internal metal gate, wherein the first high-k dielectric is sandwiched between the PFET channel structure and the shared internal metal gate and the second high-k dielectric is sandwiched between the NFET channel structure and the shared internal metal gate;
    depositing directly onto the shared internal metal gate a ferroelectric layer; and
    depositing directly onto the ferroelectric layer a shared external gate electrode.

14. The method of claim 13, wherein doping the first high-k dielectric and the second high-k dielectric comprises doping the first high-k dielectric with aluminum and doping the second high-k dielectric with a material selected from the list consisting of Group 2A and Group 3B metals.

15. The method of claim 13, wherein depositing the shared dielectric comprises depositing hafnium oxide.

16. The method of claim 13 wherein depositing the shared dielectric comprises depositing zirconium oxide.

17. The method of claim 13, wherein converting the shared dielectric to the first high-k dielectric comprises depositing aluminum and thermally annealing.

18. The method of claim 13, wherein depositing the shared internal metal gate comprises depositing titanium nitride.

19. The method of claim 13, wherein depositing the ferroelectric layer comprises depositing a hafnium oxide.

20. The method of claim 13, wherein depositing the shared external gate electrode comprises depositing a material selected from the group consisting of titanium nitride, tantalum, and tungsten.

* * * * *